(12) United States Patent
Canale et al.

(10) Patent No.: US 8,859,103 B2
(45) Date of Patent: Oct. 14, 2014

(54) GLASS WAFERS FOR SEMICONDUCTOR FABRICATION PROCESSES AND METHODS OF MAKING SAME

(76) Inventors: Joseph Eugene Canale, Corning, NY (US); Jeffrey Stapleton King, Menlo Park, CA (US); Gary Richard Trott, San Mateo, CA (US)

( * ) Notice: Subject to any disclaimer, the term of this patent is extended or adjusted under 35 U.S.C. 154(b) by 382 days.

(21) Appl. No.: 13/282,789

(22) Filed: Oct. 27, 2011

(65) Prior Publication Data
US 2012/0276689 A1 Nov. 1, 2012

Related U.S. Application Data

(60) Provisional application No. 61/410,599, filed on Nov. 5, 2010.

(51) Int. Cl.
| | | |
|---|---|---|
| *H01L 23/15* | (2006.01) | |
| *H01L 21/50* | (2006.01) | |
| *B32B 17/06* | (2006.01) | |
| *C03C 17/00* | (2006.01) | |
| *H01L 21/02* | (2006.01) | |

(52) U.S. Cl.
CPC ........... *C03C 17/00* (2013.01); *H01L 21/02491* (2013.01); *H01L 21/0245* (2013.01); *H01L 21/02444* (2013.01); *H01L 21/02422* (2013.01); *H01L 21/02488* (2013.01)
USPC .......................................... 428/426; 428/428

(58) Field of Classification Search
None
See application file for complete search history.

(56) References Cited

U.S. PATENT DOCUMENTS

| | | | |
|---|---|---|---|
| 4,822,718 A | 4/1989 | Latham et al. | 430/271 |
| 6,642,175 B2 | 11/2003 | Mitsuo et al. | 503/209 |
| 7,369,237 B2 | 5/2008 | Ikeno et al. | 356/399 |
| 7,419,346 B2 | 9/2008 | Danna et al. | 414/222.11 |
| 7,422,828 B1 | 9/2008 | Kim | 430/5 |
| 7,532,940 B2 | 5/2009 | Ishizawa | 700/56 |
| 7,723,813 B2 | 5/2010 | Kanakasabapathy et al. | 257/421 |
| 7,749,915 B2 | 7/2010 | Drechsler et al. | 438/725 |
| 8,101,499 | 1/2012 | Huang et al. | |
| 2006/0024981 A1* | 2/2006 | Nakamura et al. | 438/795 |
| 2006/0252246 A1 | 11/2006 | Paik et al. | |
| 2009/0189054 A1* | 7/2009 | Campidell et al. | 250/206 |
| 2009/0194865 A1* | 8/2009 | Sekiguchi et al. | 257/692 |

FOREIGN PATENT DOCUMENTS

| | | | | |
|---|---|---|---|---|
| JP | 4-44210 | | 2/1992 | |
| JP | 04318955 A1 * | | 11/1992 | |
| WO | 2008/133887 | | 11/2008 | C09C 1/48 |

OTHER PUBLICATIONS

SP10-296, WO, Feb. 2, 2012, International Search Report and Written Opinion of the Int'l Searching Authority.
"Round Glass Wafers and Glass Substrates With and Without SEMI Flats"; XP007920139.
"PYREX Wafers and BOROFLOAT Wafers Glass Wafers Made of Borosilicate Glass"; XP007920140.

* cited by examiner

*Primary Examiner* — David Sample

(57) ABSTRACT

The present disclosure is directed to the use of glass wafers as carriers, interposers, or in other selected applications in which electronic circuitry or operative elements, such as transistors, are formed in the creation of electronic devices. The glass wafers generally include a glass having a coefficient of thermal expansion equal to or substantially equal to a coefficient of thermal expansion of semiconductor silicon, an indexing feature, and a coating on at least a portion of one face of the glass.

7 Claims, 4 Drawing Sheets

Figure 1
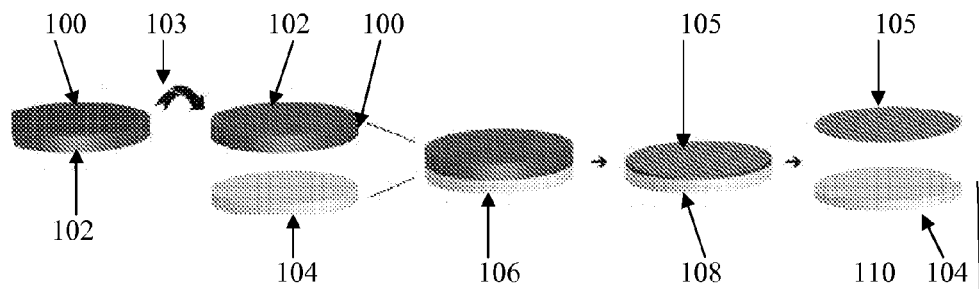
Figure 2
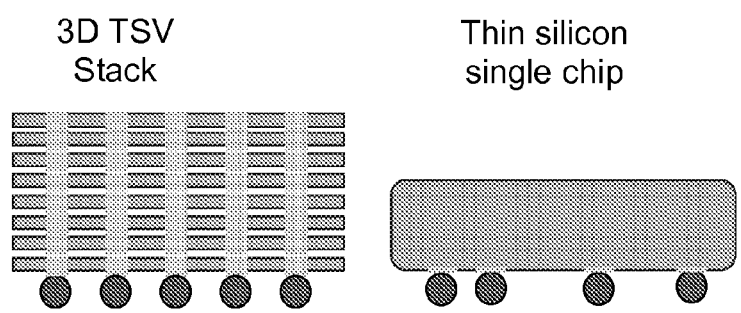
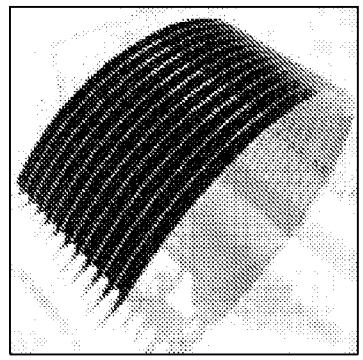
Figure 3A
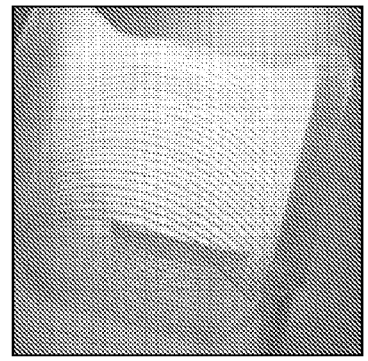
Figure 3B

GLASS WAFERS FOR SEMICONDUCTOR FABRICATION PROCESSES AND METHODS OF MAKING SAME

CROSS-REFERENCE TO RELATED APPLICATION

This application claims the benefit of priority under 35 USC 119 of U.S. Provisional Patent Application Ser. No. 61/410,599 filed on Nov. 5, 2010 the content of which is relied upon and incorporated herein by reference in its entirety.

TECHNICAL FIELD

The disclosure is directed to glass wafers that can be used as a replacement for silicon wafers in semiconductor fabrication processes, including in the automated equipment used to produce integrated circuits and electronic elements.

BACKGROUND

There is a growing need for less expensive methods of processing silicon wafers to make integrated circuits (ICs), MEMS devices, logic ICs, power devices, and other elements used in modern electronics. At the present time, silicon wafers are used not only for the active integrated circuitry and other circuit elements, but are also used as carriers, interposers, and mechanical elements that do not contain circuitry or other features used in electronics. It is highly desirable to find an alternative to the use of silicon wafers as carriers, interposers, and other elements to further lower the cost of the final packaged parts. However, finding a less expensive alternative to silicon wafers is not an easy task. The fabrication tools used in the process of making ICs and other devices include, among other items, automatic loading and unloading equipment (e.g., cassette autoloaders that load and unload into lithographic equipment, etching equipment, and the like). These cassette autoloaders depend on various sensors to determine the placement, position, and confirmation of location as the wafers move in and out of the tools. This is accomplished by the use of a wafer flat, notch, or other like mechanism positioned at the edge of the wafer, which must be oriented correctly within the tool. The problem is that many of the sensors were designed to sense silicon semiconductor wafers. Existing sensors are mechanical, optical, and/or inductive/capacitive in nature. While the mechanical-type sensors may work with other materials, the electrical or optical sensors do not always work with other materials. While it is possible to change every sensor on the tools to enable sensing of wafers made of other (i.e., non-silicon) materials, this is undesirable in a manufacturing environment. Aside from the cost and effort of retrofitting the tools, various levels of manufacturing re-qualification would be required to ensure standard product specifications are not changed, which can require a large amount of work. Another class of wafer chucks, commonly called electrostatic chucks, use electrostatic fields to hold the wafer in place, but these would not work with wafer materials that are not susceptible to electrostatic fields like dielectrics such as glass materials. The different dielectric properties of glasses result in the failure of electrostatic chuck designed only for silicon wafers to work properly.

While silicon is the existing material of choice for carrier, interposer, and other applications, it is desirable that less expensive materials, and methods of using these materials in existing equipment without costly modifications, be found. The present disclosure is thus directed to the use of glass materials in existing equipment without costly and time consuming modifications of the equipment.

BRIEF SUMMARY

The present disclosure is directed to the use of glass wafers as carriers, interposers, or other selected applications in which circuitry or operative elements, such as transistors, are formed. In its intended uses, is it particularly important that the glass has a coefficient of thermal expansion ("CTE") substantially equal (i.e., within about 10%, and in some cases within about 5%) to the CTE of semiconductor silicon.

An exemplary glass that can be used in such application is a alkaline-earth boro-aluminosilicate glass sold commercially as Corning EAGLE XG® (hereinafter "EXG") glass. The EXG glass wafers can be used for package interposers, for construction of galvanic isolation elements, or as a process carrier to be used when an attached silicon wafer is thinned for final packaging. In all of these examples, the glass wafer must be carried in and out of the automated equipment. However, one problem with using glass is that many of the sensors are designed to sense silicon semiconductor wafers.

In accordance with the present disclosure, a layer, film, or coating of a selected material is applied to a selected glass, the glass having a CTE equal to or substantially equal to the CTE of a semiconductor silicon composite that can include circuitry and other layers. For example, the CTE of a silicon wafer is about $3.2 \times 10^{-6}/°$ C. The CTE of the glass carrier should be chosen so that it substantially matches that of the final silicon composite. For example, if minimum circuitry and other layers are placed on the silicon wafer of CTE $3.2 \times 10^{-6}/°$ C., then a glass such as Corning Eagle XG which has a CTE of approximately $3.1 \times 10^{-6}/°$ C. is an appropriate glass. However, if the wafer is, for example, a very thin (e.g., about 10 μm) wafer with integrated circuits having, for example, multiple layers of metal and insulators (e.g., in the range of 5-20 layers), then the CTE of this composite device will be much higher than the $3.2 \times 10^{-6}/°$ C. CTE of the Si wafer alone. Accordingly, one would chose a carrier having a higher CTE; that is, a carrier having a CTE that approximates the CTE of the final composite, in order to prevent, for example, warpage of the composite, which can cause non-detectable damage to the device. An example of a carrier with a higher CTE is an alkali aluminosilicate glass sold commercially as Corning GORILLA® Glass, which has a CTE of about $9.0 \times 10^{-6}/°$ C.

In further accordance with this disclosure, the layer, film, or coating is one that changes the dielectric properties of the glass wafer and/or is applied to the glass wafer using non-vacuum techniques. The layer, film, or coating is also one that can be detected by automatic loading sensors and may improve the functionality of gripping the wafer in existing electrostatic chucks. The layer, film, or coating is designed to be applied to one side of the wafer so as not to interfere with the fabrication of the circuits on the front side of the wafer. The back side is the preferred surface for the layer, film, or coating. This allows for the auto-loading of sensors of presently-used equipment to function properly in their current configuration without the need to replace the sensors or otherwise make costly changes to the equipment. The dielectric properties that are changed can be in the optical domain, if the target is an optical sensor in the load and unload tools, or it could be the electrostatic domain if the target is to allow for the function of an electrostatic wafer chuck.

When the wafers are finished at the end of the process, the back side film can optionally be removed (e.g., by a short chemical-mechanical polishing process or other removal processes known to those skilled in the art).

There are many ways to add features to the back of a wafer for alignment and sensing purposes. The most straightforward method is to add a thin film metal pattern to the back side. Thin film metals are robust in terms of process compatibility, survive high temperature steps, and cause minimal cross-contamination between fabrication tools. However, the cycle time associated with loading and unloading a vacuum-coating chamber that is used to deposit the thin film metal pattern is long, and this vacuum process adds costs. Furthermore, patterning the metal can require photoresists, masks, and a lithography step that add further costs. In addition, the metal may not be inert to some of the subsequent processing steps to which it will be subjected. For example, aluminum metal on the backside of a carrier may be etched when the front side aluminum layer is wet etched. Other kinds of vacuum-deposited films can be considered by those skilled in the art, but there is always a cost associated with the time required to load and unload wafers from a vacuum deposition system.

Thus, a more desirable solution is to find a patterning method that does not require vacuum deposition but has all of the desirable attributes of a patterned layer that can be used to activate auto loading sensors. For example, standard photoresist films can be applied to the glass wafer to change the dielectric properties in the optical domain such that the photoresist coated wafer will activate the optical sensors. This is accomplished by heating the photoresist to a temperature above its normal use temperature to result in an increase the optical absorption of the photoresist. Heating the photoresist to a temperature in the range of 320-400° C., for example, 350° C., will make the photoresist optically opaque. In an alternative embodiment one can selected a photoresist containing carbon particles or one can add carbon particles to the photoresist. Carbon in the photoresist changes both the optical properties and the electrostatic properties.

In one embodiment, the disclosure is directed to glass wafers suitable for use in semiconductor fabrication process tooling to produce electronic circuit elements. The glass wafers can have a CTE substantially equal to the CTE of semiconductor silicon, an indexing feature such as a notch or a flat, and a coating on at least a portion of one face of the wafer. The coating can extend inward from the edge of the wafer; wherein the coating can be an opaque coating that changes the optical characteristics of at least a portion of a glass wafer face, a transparent coating that changes the dielectric properties of the glass, combinations thereof, or the like. In one embodiment, the coating is an opaque coating that extends inward from the edge of said wafer for a distance in the range of about 5 to about 20 mm. In another embodiment, the opaque coating covers the entire surface of the face. In a further embodiment, the coating changes the dielectric properties of the glass wafer to make it suitable for use with electrostatic chucks. In an additional embodiment, the CTE of the glass wafer is selected to be substantially within 5% of the CTE of a semiconductor silicon composite device placed thereon. In a different embodiment, the opaque coating is formed from an organic polymer that modifies the optical properties. Further, the opaque coating can comprise an ink or a dye. Additionally, the opaque coating can comprise a black permanent marker ink or equivalent, a heat-treated thin organic layer, a carbon-filled photoresist material, a darkened (cured) spin-on photoresist, a carbon-filled spin-on-glass material, or an inkjetted carbon-based ink. In other situations, the opaque coating can comprise an inkjetted metallic ink, silicon nanoparticles, an electroless plated metal, an electroless plated black oxide used in inkjet technology, a sintered black screen-printed glass frit material, or a photoluminescent material having an excitation at a wavelength corresponding to current sensor illumination sources.

In another embodiment, the glass wafers are suitable for use in lithographic processes to fabricate electronic circuit elements. These glass wafers can have a CTE substantially equal to the CTE of a semiconductor silicon composite, an indexing feature such as a notch and a flat, and a conducting or semiconducting coating on at least a portion of one face of the wafer. The coating can extend inward from an edge of the wafer to change the electrical properties of the glass wafer. The glass wafer material can function as a carrier, an interposer, or a substrate for integrated passive devices (e.g., resistors, capacitors and inductors).

BRIEF DESCRIPTION OF THE DRAWINGS

FIG. 1 is an example illustration of various steps in the formation of a thin Si wafer by using a carrier wafer.

FIG. 2 is an illustration of an IC device package, showing a 3D TSV stacked memory, a thin CPU chip all co-located on an interposer, which, in this case, is a 3D TSV stack.

FIGS. 3A and 3B are images of silicon wafers and glass wafers, illustrating the different optical properties respectively.

DETAILED DESCRIPTION

Figure 4A:
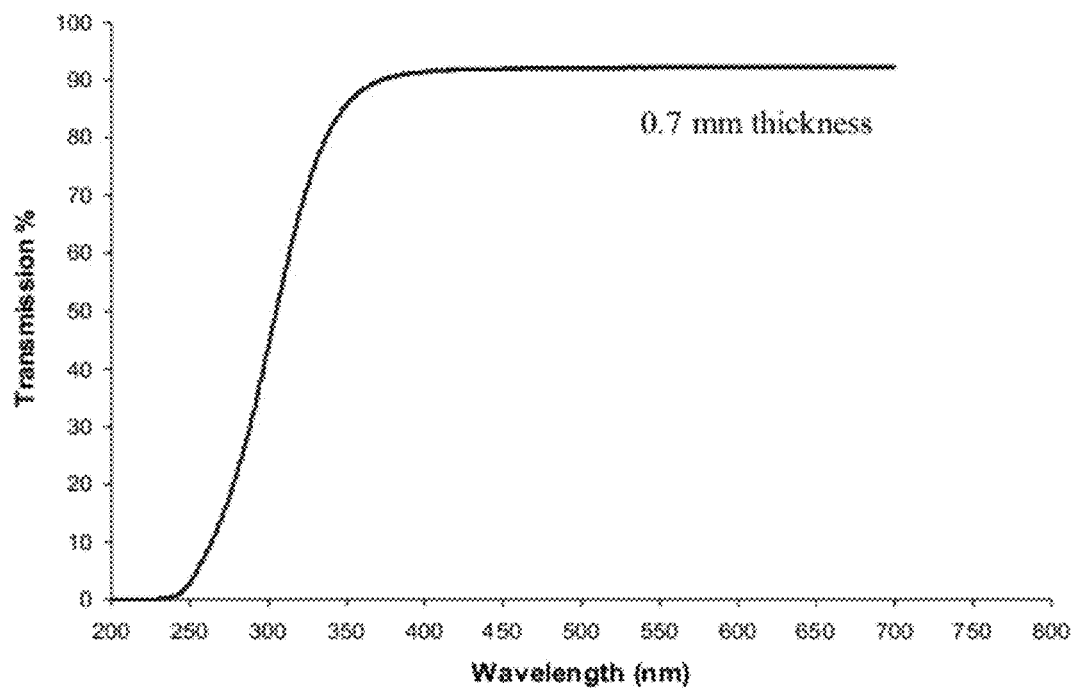
FIGS. 4A and 4B are graphs illustrating percent optical transmission versus wavelength in the visible light spectrum for an exemplary wafer glass and silicon, respectively.

Herein, the formation of a circuit or an integrated circuit is used as an example of the use of glass carrier wafers in lithographic processes. In addition to circuitry or integrated circuits, the teachings herein are applicable to processes that can be used to produce other devices, including MEMS, LED, CIS, c-PV, memory, Logic ICs, RF/Analog ICs, microfluidic devices, microdisplays, Laser/VCSEL, fuel cells, microbatteries, power devices, and the like. For convenience, the term "coating" is intended to include films, coatings, or layers disposed on a surface. Generally, the coatings will involve an opaque coating that blocks light used in fabrication tool sensors, which ranges from the infrared to the visible to the ultraviolet (about 1300 nm to about 350 nm), or a transparent coating to change the dielectric properties of the wafer so that the wafer can be used with electrostatic chucks (e.g., a $SnO_2$ coating for changing dielectric properties of the wafer).

The initial steps of making a thin Si wafer having a circuit thereon are illustrated in FIG. 1. Reading FIG. 1 from left to right, a temporary wafer bonding material 100 (e.g., those materials sold commercially as WaferBOND™ HT), is applied over the active circuitry present on a face of a silicon wafer 102. After applying the wafer bonding material 100, the wafer 102 is flipped over (illustrated as process step 103) and bonded to a carrier wafer 104 to produce an article 106 in which the wafer bonding material 100 is between the silicon wafer (top) 102 and wafer carrier 104. The backside (i.e., the non-bonded side) of the silicon wafer 102 of article 106 can then be thinned as represented by step 108 to use directly in the thinned form factor, or processed to expose vias from the front Si surface on the backside to enable 3-dimensional through-silicon via (3D-TSV) stacking, such as that shown in FIG. 2. The processing on the backside may also include the addition of redistribution layers, which can involve the deposition of a thin oxide film (e.g., $SiO_2$, which can be formed by exposure to oxygen in a furnace), coating the oxide surface with a photoresist, exposing the selected sections of the photoresist to UV light through a photomask to define a circuit pattern, removing the exposed photoresist to expose the underlying oxide layer, acid etching to remove exposed oxide, and removing the unexposed photoresist. Additional layers (not illustrated) of materials can then be laid down. For example, polysilicon (which is electrically conducting) can be deposited, through further steps of film deposition, masking, and etching, to produce layers in which each layer has a unique pattern. Other steps (also not illustrated) include, for example, doping with selected materials to alter electrical conductivity in selected areas and metallization to form electrical connections between different elements in the pattern. After each of the patterning steps to form a circuit are completed, patterned thin silicon wafer 105 has been formed. In the last step, illustrated as 110, the completed, patterned silicon wafer 105 and wafer carrier 104 are then separated. The separated, patterned silicon wafer 105 can then be used in the formation of an integrated circuit device, such as those illustrated in FIG. 2.

At the present time, silicon wafers are commonly used as carrier wafers. In accordance with this disclosure, glass wafers can replace the silicon wafers, thereby providing benefits not afforded by the use of silicon carrier wafers (e.g., reduced cost and improved high frequency response).

The glass used to make the glass wafers described herein can be chosen from a soda lime glass, a borosilicate glass, an alkali aluminosilicate glass, an alkali aluminoborosilicate glass, or the like. The glass optionally may be strengthened, either thermally, chemically, or by combinations of thermal and chemical treatments. The strengthened glass has at least one layer under compressive stress (compressive layer). Exemplary glasses include alkaline-earth boro-aluminosilicate glasses sold commercially as Corning EAGLE XG® or those alkali aluminosilicate glasses sold commercially as Corning GORILLA® Glass.

Figure 4B:
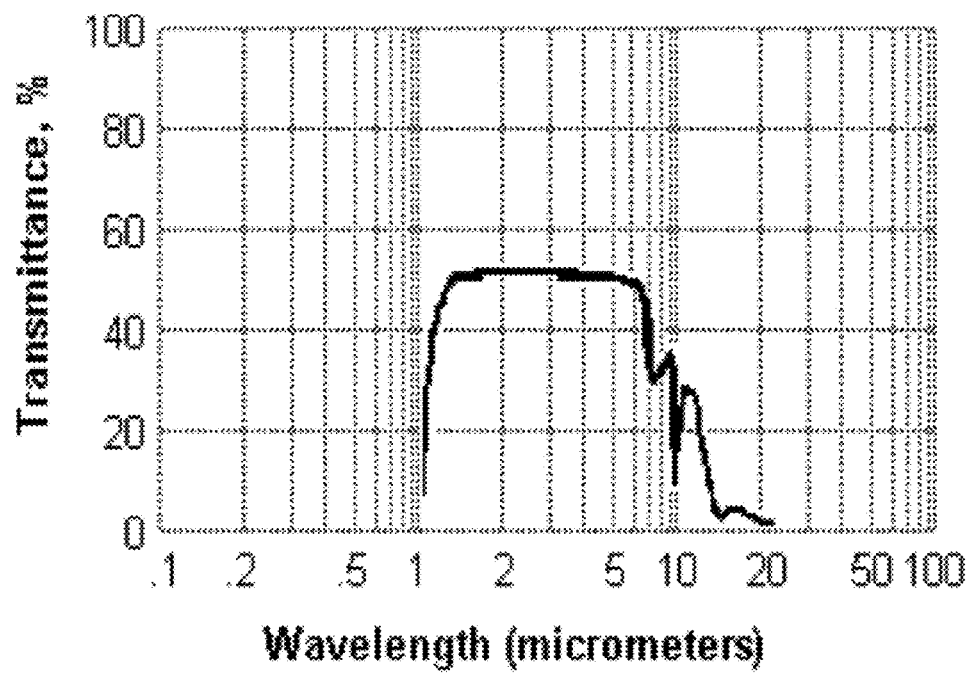

FIG. 3A illustrates silicon carrier wafers currently used in the industry, and FIG. 3B illustrates carrier glass wafers that can be used to replace silicon wafers. FIG. 4A illustrates optical transmission versus wavelength (in nanometers) for an exemplary glass material, Eagle® XG (Corning Incorporated), showing glass transmission that begins at approximately 250 nm and reaches 90+% transmission over the approximate range of 350 nm to >750 nm. FIG. 4B, which provides optical transmission versus wavelength (in micrometers) for silicon, illustrates that silicon is not transmissive in the range of 0.2 μm to 1 μm (200-1000 nm).

Figure 5:
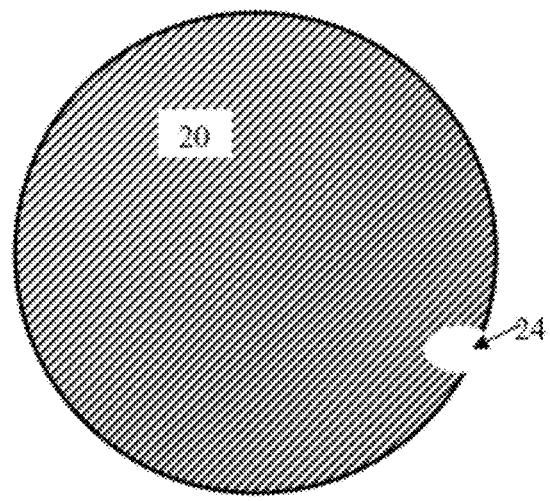
FIG. 5 is a diagram of a silicon wafer having an indexing notch.
Figure 6:
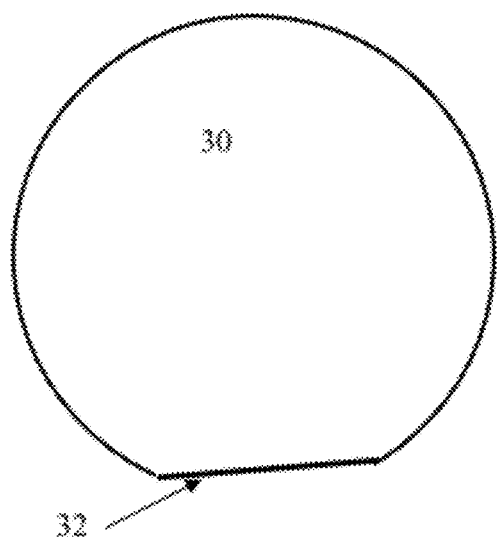
FIG. 6 is an illustration of a glass wafer having an indexing flat.

Semiconductor fabrication processes, including the process of forming an integrated circuit (IC) on a silicon wafer, are carried out using automated machinery. In order for the wafer to be properly positioned or oriented during each step of the IC formation process, the wafer and carrier wafer can have a notch or flat along a portion of their edge that is used for orientation of the wafer and carrier. FIG. 5 illustrates a silicon wafer 20 having a notch 24 along its edge. Alternatively, the silicon wafer 20 could have a flat along its edge. FIG. 6 illustrates a glass wafer 30 having a flat 32 along its edge. Alternatively the glass wafer 30 could have a notch along its edge. Notches and flats are specified in the SEMI™ semiconductor wafer standards. However, the notches and flats are not needed if the objective is non-standard MEMS processing, and the tools are modified appropriately.

Figure 8A:
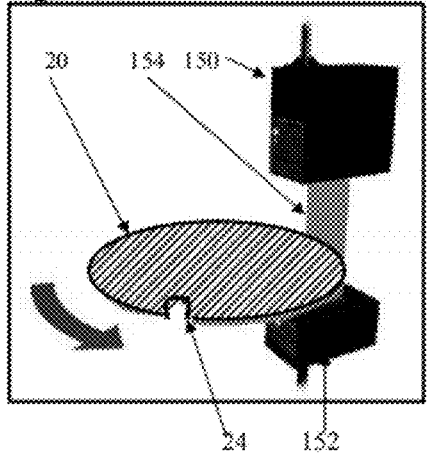
FIG. 8A illustrates a silicon wafer having a notch along its edge, and the wafer 20 is positioned on a rotating cassette (not illustrated).
Figure 8B:
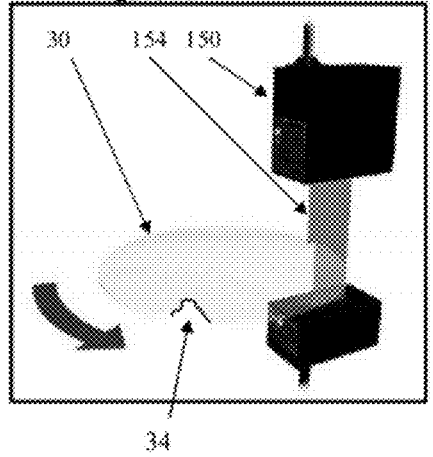
FIG. 8B illustrates a glass wafer having a notch along its edge on a rotating cassette.

As shown in FIGS. 8A and 8B, a common orientation method involves using optical sensors having a light source 150, which is typically a visible light source, and a detector 152 for generating and detecting a light beam 154. FIG. 8A illustrates a silicon wafer 20 having a notch 24 along its edge, and the wafer 20 is positioned on a rotating cassette (not illustrated). The surface of the silicon wafer 20 is opaque and it will block the passage of beam 154 between the source 150 and detector 152. However, when the wafer 20 is rotated such that the notch 24 is in the location of light beam 154, the detector 152 senses the light beam and stops the rotation of the cassette. The stopped cassette, holding the wafer 20, is in the proper position for transfer to the lithography device for processing of the wafer to form a circuit. FIG. 8B illustrates a glass wafer 30 having a notch 34 along its edge on a rotating cassette. However, since glass wafers are transparent, the light beam 154 will pass through the glass as well as the notch. That is, the sensor cannot distinguish between the glass wafer and the notch. Consequently, the glass wafer will not stop rotating, and transfer to the lithography device will not occur.

In principle, the carrier disc is the same size as a silicon IC wafer disc. However, in practice, there is sometimes a need for the carrier disc to be slightly larger (e.g., +1 mm in diameter). The reason is, as the silicon wafer is made thinner (FIG. 1), the edge of the wafer has a side profile that starts as a "C"-shape, and becomes a ½ "C"-shape, resulting in a sharp point. The sharp edge can break off and cause scratching when the silicon wafer is subjected to a grind/polish thinning. Consequently, the carrier wafer is sometimes larger than the IC wafer so that the meniscus from the temporary bonding agent will coat the edge and hold onto the sharp edge. The +1 mm larger size of the carrier wafer is within the semiconductor standard specifications, and normally has a notch or flat just for general compatibility. However, if the tool does not need to locate the flat, or if that location step can be removed from the software sequence, then the glass wafer does not need an orientation mark. For example, CMOS image sensors do not always have an orientation mark.

The present disclosure describes glass wafers that overcome the problems associated with sensors not functioning with glass wafers, and methods of modifying such wafers. While vacuum methods can be used to make the coatings on the glass wafer disclosed herein, in some embodiments, non-vacuum methods (e.g., spray coating, spin coating, brush or roller painting, or the like) can be used to lower the cost.

Figure 7A:
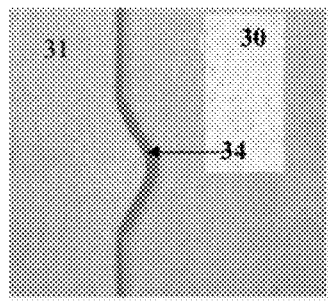
FIG. 7A illustrates glass wafer on a background, the glass wafer having a notch at its edge.
Figure 7B:
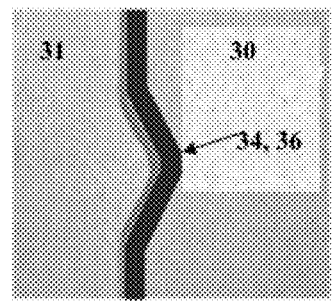
FIG. 7B illustrates a wafer having a notch lying on top of a surface, and wafer has an opaque coating applied to a facial surface of the glass for a distance inward from the edge.

There are many examples of film or coating materials that can be used to change the dielectric, optical, and/or electric properties. In one embodiment, these materials are used to pattern the carrier only in the vicinity of the sensor (usually at the carrier's edge). In another embodiment, the material or the film can be applied to the whole carrier surface with no pattern. FIG. 7A illustrates a glass wafer 30 having a notch 34 lying on top of a surface 31. In FIG. 7A, no coating has been applied to any surface or edge of wafer 30. The shadow area extending from notch 34 to the top and bottom of FIG. 7A is the uncoated edge of glass 30. FIG. 7B illustrates a wafer 30 having a notch 34 lying on top of a surface 31, and wafer 30 has an opaque coating 36 applied to a facial surface of the glass for a distance of 5-20 mm inward from the edge. As the coated edge rotates, the optical sensor does not read the light coming from the optical source as has been described above because the coating 34 blocks the light. However, when the notch reaches the light beam, it is read by the optical sensor and the rotating motion is halted. The silicon wafer is accordingly in proper alignment for further processing.

Figure 7C:
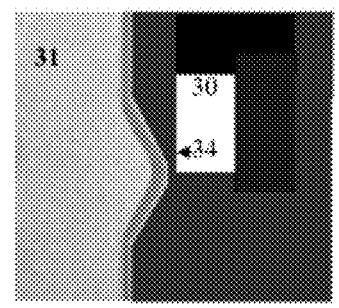
FIG. 7C illustrates a glass wafer having a notch lying on a surface, and wafer has an opaque coating on the an entire face of wafer.

FIG. 7C illustrates a glass wafer 30 having a notch 34 lying on a surface 31, and wafer 30 has an opaque coating on the an entire face of wafer 30. Similarly, as the coated face rotates the optical sensor does not read the light coming from the optical source as has been described above because the coating 34 blocks the light. However, when the notch reaches the light beam it is read by the optical sensor and the rotating motion is halted. The silicon wafer is accordingly in proper alignment for further processing. The coatings applied to the glass wafers are opaque coatings. While the opaque coating can be any color that blocks visible light, in one embodiment, the coatings are dark in color (e.g., dark brown, dark blue, dark purple, and the like). In another embodiment the coating is black.

There are various process criteria that the coatings or films must meet to not interfere with normal manufacturing process flow. The criteria applied will be specific to the application. For example, a silicon wafer process flow will be more sensitive to chemical contamination than a MEMS-fabrication process. In general, the criteria are:
1. The ability to withstand process temperatures up to 400° C.
2. Chemical resistance to normal inorganic acid etches.
3. Chemical resistance to standard solvents used in photoresist processes.
3. That they add no chemical contamination to the user's processes.

Based on the above criteria, there are many exemplary coating or film materials to be considered, as well as a large number of non-vacuum deposition techniques. They can be generally classified to include:
1. Polymers that can be decomposed by heating (e.g., heating a polymer up to 400° C. in air).
2. Polymers that have an additive that remains intact at 400° C. Many ink jet processes use this kind of material.
3. Additives such as metal particles, semiconductors, or doped glasses. It is noted that metal and semiconductor particles change both the optical and electrostatic properties.
4. Electrochemical depositions resulting in films meeting the criteria given above.

Some examples, without limitation, of coating materials that can be used in accordance with this disclosure include:
1. Black permanent marker inks or the equivalent, to create a black mark on a glass wafer near the specification locator.
2. Thin organic layers that are burned off in an oven resulting in a permanent change in the optical absorption.
3. Carbon-filled photoresist materials (e.g., the commercially available TOK resist that is used on color filter glass processes and can be used for black decoration).
4. Darkened (cured) spin-on photoresist, the darkening being achieved by "burning-in" the photoresist to a temperature of up to 400° C. in air.
5. Carbon-filled spin-on-glass materials.
6. Carbon inks used in inkjet technology.
7. Metal inks that can be used in inkjet technology.
8. Metal inks that can respond to inductive sensors.
9. Silicon nanoparticle inks that will give the glass characteristics to a silicon semiconductor wafer.
10. Electroless plated metals, for example, nickel.
11. Electroless plated black oxide.
12. Black screen printed frit.
13. Photoluminescent materials having an excitation at wavelengths corresponding to current illumination sources.

After the above materials have gone through a proper processing sequence, they are chemically inert and will not impact other silicon fabrication process steps. Furthermore, there are simple tools available to deposit them locally near the wafer notch to use the minimum amount of material to achieve local registration. For example, silk screen printing, inkjet application, spraying, roller or pad application, stencil printing, stamping, micro-contact printing and other non-vacuum method of applying inks and metals to surfaces can be used. Using non-vacuum coating technology and simple patterning processes will result in low cost registration markings to enable current silicon-processing tools to load and unload the glass wafers. Secondly, the initial black registration mark can serve as a zero order masking level for subsequent photomask alignments.

In silicon fabrication processes that produce circuit and electronic elements, the coated and cured coated glass wafers could offer the following additional advantages:
1. They survive processing temperatures (~400° C.).
2. There is no cross contamination.
3. Block visible and UV light to see them in optical system tools like mask aligners.
4. They contain no alkali or Au metals that would change the electrical properties of a silicon p-n junction.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

The invention claimed is:

1. A glass wafer for use in semiconductor fabrication equipment to produce electronic circuit elements, the glass wafer comprising:
a glass having a coefficient of thermal expansion from about $2 \times 10^{-6}/°$ C. to about $9 \times 10^{-6}/°$ C.;
an indexing feature configured to be recognized by the semiconductor fabrication equipment; and
a coating on at least a portion of one face of the glass, wherein the coating extends inward from an outer edge of the glass, wherein the coating changes an optical characteristic of at least a portion of the one face of the glass or changes a dielectric property of the glass, and wherein the coating is an organic polymer, a black permanent marker ink, a heat treated thin organic layer, a carbon-filled photoresist material, a darkened (cured) spin-on photoresist, a carbon-filled spin-on-glass material, an inkjetted carbon based ink, silicon nanoparticles, a sintered black screen-printed glass frit material, or a photoluminescent material.

2. The glass wafer according to claim 1, where the coating is an opaque coating that extends inward from the outer edge of the glass for a distance of about 5 millimeters to about 20 millimeters.

3. The glass wafer according to claim 1, wherein the coating covers all of the one face of the glass.

4. The glass wafer according to claim 1, wherein the change in the dielectric property of the glass is effective to make the glass wafer suitable for use with electrostatic chucks.

5. The glass wafer according to claim 1, wherein the coating is formed from an organic polymer that modifies the optical characteristic of the glass.

6. The glass wafer according to claim 1, wherein the coating comprises a black permanent marker ink, a heat treated thin organic layer, a carbon-filled photoresist material, a darkened (cured) spin-on photoresist, a carbon-filled spin-on-glass material, or an inkjetted carbon based ink.

7. The glass wafer according to claim 1, wherein the coating comprises silicon nanoparticles, a sintered black screen-printed glass frit material, or a photoluminescent material.

* * * * *